United States Patent
Usui

(10) Patent No.: US 12,114,574 B2
(45) Date of Patent: Oct. 8, 2024

(54) POWER GENERATION SYSTEM

(71) Applicant: Murata Manufacturing Co., Ltd., Nagaokakyo (JP)

(72) Inventor: Tomoyasu Usui, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 223 days.

(21) Appl. No.: 17/983,579

(22) Filed: Nov. 9, 2022

(65) Prior Publication Data

US 2023/0077655 A1 Mar. 16, 2023

Related U.S. Application Data

(63) Continuation of application No. PCT/JP2020/044353, filed on Nov. 27, 2020.

(30) Foreign Application Priority Data

May 18, 2020 (JP) .................. 2020-086584

(51) Int. Cl.
*H10N 15/10* (2023.01)
*H02N 2/00* (2006.01)
*H02N 10/00* (2006.01)
*H02N 11/00* (2006.01)

(52) U.S. Cl.
CPC .................. *H10N 15/15* (2023.02)

(58) Field of Classification Search
CPC .......... H02N 11/00; H02N 2/00; H02N 10/00; H10N 15/10

USPC ..................... 310/306, 311, 323.06
See application file for complete search history.

(56) References Cited

U.S. PATENT DOCUMENTS

2015/0256108 A1  9/2015  Kim et al.

FOREIGN PATENT DOCUMENTS

| JP | 2014113029 A | 6/2014 | |
| JP | 2015220836 A | 12/2015 | |
| JP | 2019054101 A * | 4/2019 | ............. B23Q 1/545 |
| JP | 2019138259 A * | 8/2019 | |
| JP | 2019148244 A | 9/2019 | |
| WO | WO-2015174486 A1 * | 11/2015 | ............... H02N 1/08 |

OTHER PUBLICATIONS

International Search Report in PCT/JP2020/044353, mailed Feb. 16, 2021, 3 pages.
Olsen et al., "A Pyroelectric Energy Converter Which Employs Regeneration," Ferroelectrics, 1981, vol. 38, pp. 975-978.

* cited by examiner

*Primary Examiner* — Jose A Gonzalez Quinones
(74) *Attorney, Agent, or Firm* — ArentFox Schiff LLP

(57) ABSTRACT

A power generation system that includes: a ceramic element including a ferroelectric ceramic having a Curie temperature of 90° C. or lower and a space charge polarization; and a power extraction device that extracts power from the ceramic element when a temporal temperature change exceeding the Curie temperature is applied to the ferroelectric ceramic.

20 Claims, 3 Drawing Sheets

POWER GENERATION SYSTEM

CROSS REFERENCE TO RELATED APPLICATIONS

The present application is a continuation of International application No. PCT/JP2020/044353, filed Nov. 27, 2020, which claims priority to Japanese Patent Application No. 2020-086584, filed May 18, 2020, the entire contents of each of which are incorporated herein by reference.

FIELD OF THE INVENTION

The present disclosure relates to a power generation system using ceramics and a power generation method.

BACKGROUND OF THE INVENTION

In recent years, with the spread of IoT technology, various environmental power generation technologies are required from the viewpoint of permanent power supply to devices. As such an environmental power generation technology, a technology of generating power by a temporal temperature change has been studied. For example, Non-Patent Document 1 discloses a system that generates power by using a ferroelectric and rotating a thermodynamic cycle including a temperature change to the ferroelectric and application and removal of an external electric field. In addition, Patent Document 1 discloses that the power generation efficiency is improved by reviewing the electric field application profile in the power generation system of Non-Patent Document 1.

Patent Document 1: Japanese Patent Application Laid-Open No. 2014-113029

Non-Patent Document 1: Randall B. Olsen, et al., Ferroelectrics, 38:1, 975-978(1981)

SUMMARY OF THE INVENTION

In the power generation systems described in Non-Patent Document 1 and Patent Document 1, it is necessary to apply an electric field from the outside in accordance with the timing of temperature change in order to perform power generation, and thus, an external circuit for applying an electric field and a control circuit for taking the timing are required.

An object of the present disclosure is to provide a power generation system and a power generation method using a ferroelectric that do not require an external circuit and a control circuit as described above.

The present disclosure includes the following aspects:

[1] A power generation system including: a ceramic element including a ferroelectric ceramic having a Curie temperature of 90° C. or lower and a space charge polarization; and a power extraction device that extracts power from the ceramic element when a temporal temperature change exceeding the Curie temperature is applied to the ferroelectric ceramic.

[2] The power generation system according to [1], wherein the Curie temperature is 60° C. or lower.

[3] The power generation system according to [1] or [2], wherein the ferroelectric ceramic is a perovskite-type ferroelectric.

[4] The power generation system according to [3], wherein the perovskite-type ferroelectric is selected from $BaTiO_3$, $(Ba,Sr)TiO_3$, $(Ba,Ca)TiO_3$, $Ba(Zr,Ti)O_3$, $Ba(Sn,Ti)O_3$, $Ba(Hf,Ti)O_3$, $(Ba,Ca)(Zr,Ti)O_3$, $(Ba,Ca)(Hf,Ti)O_3$, $(Ba,Ca)(Sn,Ti)O_3$, $Pb(Mg_{1/3}Nb_{2/3})O_3$—$PbTiO_3$, $(Pb,Sr)TiO_3$, and $(Pb,Ba)ZrO_3$, and a transition metal-doped composite oxide in which Cu, Mn, Fe, Cr, Mg, or V is added to the composite oxide.

[5] The power generation system according to any one of [1] to [4], further including a heat source constructed to apply heat to the ceramic element.

[6] A power generation method including: applying a DC electric field to a ferroelectric ceramic having a Curie temperature of 90° C. or lower at a temperature higher than the Curie temperature to generate space charge polarization inside the ferroelectric ceramic; and applying a temporal temperature change exceeding the Curie temperature to the ferroelectric ceramic to generate a pyroelectric current.

[7] The power generation method according to [6], wherein the Curie temperature is 60° C. or lower.

[8] The power generation method according to [6] or [7], wherein the ferroelectric ceramic is a perovskite-type ferroelectric.

[9] The power generation method according to [8], wherein the perovskite-type ferroelectric is selected from $BaTiO_3$, $(Ba,Sr)TiO_3$, $(Ba,Ca)TiO_3$, $Ba(Zr,Ti)O_3$, $Ba(Sn,Ti)O_3$, $Ba(Hf,Ti)O_3$, $(Ba,Ca)(Zr,Ti)O_3$, $(Ba,Ca)(Hf,Ti)O_3$, $(Ba,Ca)(Sn,Ti)O_3$, $Pb(Mg_{1/3}Nb_{2/3})O_3$—$PbTiO_3$, $(Pb,Sr)TiO_3$, and $(Pb,Ba)ZrO_3$, and a transition metal-doped composite oxide in which Cu, Mn, Fe, Cr, Mg, or V is added to the composite oxide.

According to the present disclosure, by using a ferroelectric ceramic having space charge polarization therein and a Curie temperature of 90° C. or lower, it is possible to provide a power generation system and a power generation method that do not require an external circuit for applying an electric field and a control circuit for timing.

DETAILED DESCRIPTION OF THE INVENTION

Hereinafter, a power generation system of the present disclosure will be described.

A power generation system of the present disclosure includes a ceramic element including a ferroelectric ceramic having space charge polarization therein and a Curie temperature of 90° C. or lower, and a power extraction device constructed to extract power from the ceramic element. The power generation system of the present disclosure generates a pyroelectric current by applying a temporal temperature change exceeding the Curie temperature to the ferroelectric ceramic, and generates power.

Here, the "space charge polarization" refers to a state in which a simple charge such as an ion/oxygen vacancy moves in a dielectric and is accumulated at a grain boundary or an electrode interface to generate a dipole.

Since the ferroelectric ceramic used in the power generation system of the present disclosure has space charge polarization, although the ferroelectric polarization disappears at a temperature higher than the Curie temperature, when the temperature becomes lower than the Curie temperature, the ferroelectric polarization is polarized again by the internal electric field due to the space charge polarization without application of an electric field from the outside. Therefore, unlike the power generation systems disclosed in Non-Patent Document 1 and Patent Document 1, it is not necessary to apply an electric field at a low temperature to perform polarization.

Figure 1:
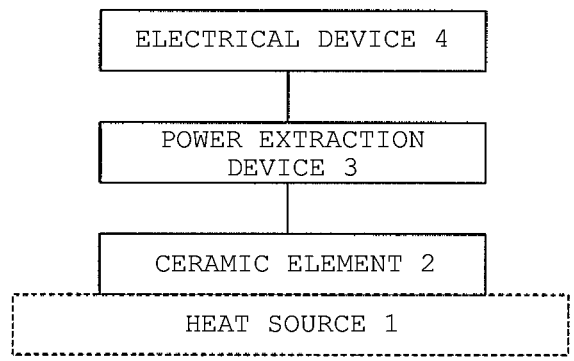
FIG. 1 is a schematic configuration diagram illustrating an example of a usage mode of a power generation system of the present disclosure.

For example, as illustrated in FIG. 1, the power generation system of the present disclosure is disposed such that a ceramic element 2 is placed under the thermal influence of a heat source 1 whose temperature changes with time. A power extraction device 3 for extracting power from the ceramic element is connected to an electrical device 4 such as a battery or a capacitor.

The ferroelectric ceramic is a ferroelectric ceramic having a Curie temperature of 90° C. or lower, preferably 60° C. or lower. By setting the Curie temperature to 90° C. or lower, power generation at a temperature sufficiently lower than the temperature at which the space charge polarization disappears becomes possible, and the disappearance of the space charge polarization due to the temperature at the time of power generation can be avoided. The Curie temperature of the ferroelectric ceramic can be preferably −50° C. or higher, and more preferably −30° C. or higher.

The Curie temperature can be measured, for example, as a point at which the relative permittivity is maximized in the temperature dependence of the relative permittivity measured using an LCR meter and a temperature adjustment variable stage.

In a preferable aspect, the ferroelectric ceramic is a perovskite-type ferroelectric.

Examples of the perovskite-type ferroelectric include a composite oxide such as $BaTiO_3$, $(Ba,Sr)TiO_3$, $(Ba,Ca)TiO_3$, $Ba(Zr,Ti)O_3$, $Ba(Sn,Ti)O_3$, $Ba(Hf,Ti)O_3$, $(Ba,Ca)(Zr,Ti)O_3$, $(Ba,Ca)(Hf,Ti)O_3$, $(Ba,Ca)(Sn,Ti)O_3$, $Pb(Mg_{1/3}Nb_{2/3})O_3$—$PbTiO_3$, $(Pb,Sr)TiO_3$, and $(Pb,Ba)ZrO_3$, and a transition metal-doped composite oxide obtained by adding Cu, Mn, Fe, Cr, Mg, or V to the composite oxide. These may be used singly or in combination of two or more kinds thereof.

In a preferable aspect, the ferroelectric ceramic can be the transition metal-doped composite oxide. By adding the transition metal, stronger space charge polarization can be formed in the pretreatment described later.

The addition amount of the transition metal to be added can be preferably 0.01 mol % to 1.0 mol %, preferably 0.1 mol % to 1.0 mol %, more preferably 0.2 mol % to 1.0%, and for example, 0.2 mol % to 0.6 mol % with respect to the composite oxide. By adding such an amount of transition metal, attenuation of the pyroelectric current during power generation can be suppressed.

In one aspect, the perovskite-type ferroelectric can be one or more selected from a composite oxide selected from $(Ba,Sr)TiO_3$, $(Ba,Ca)TiO_3$, $Ba(Zr,Ti)O_3$, and $(Pb,Sr)TiO_3$, and a transition metal-doped composite oxide to which Cu, Mn, or Fe is added.

The composite oxide and the transition metal-doped composite oxide can be synthesized by a solid phase reaction method, a coprecipitation method, a hydrothermal method, an oxalic acid method, or the like. Preferably, the composite oxide and the transition metal-doped composite oxide are synthesized by a solid phase reaction method using an oxide and a carbonate of each element as raw materials.

The ferroelectric ceramic used in the power generation system of the present disclosure has space charge polarization.

The space charge polarization is generated by applying a DC electric field to the ferroelectric ceramic at a temperature higher than the Curie temperature of the ferroelectric ceramic. Hereinafter, such processing is also referred to as "pretreatment".

The temperature at the time of applying the DC electric field can be preferably 80° C. to 200° C., more preferably 100° C. to 180° C., and still more preferably 130° C. to 160° C.

The DC electric field can be preferably 1 kV/mm to 10 kV/mm, and more preferably 1.5 kV/mm to 5 kV/mm.

The time for applying the DC electric field can be preferably 30 minutes or more, and more preferably 1 hour or more.

In a preferable aspect, after a DC electric field is applied at a high temperature, the ferroelectric ceramic is cooled to room temperature, for example, 20° C. while the DC electric field is applied. As described above, by cooling the ferroelectric ceramic while applying the DC electric field, larger space charge polarization can be obtained.

The space charge polarization can be confirmed by measuring a hysteresis curve (P-E hysteresis curve) of electric field-electric polarization at room temperature. When the P-E hysteresis curve is non-target with respect to the origin, the ferroelectric ceramic is determined to have the space charge polarization. It can also be confirmed by performing thermally stimulated depolarization current (TSDC) measurement.

The space charge polarization can disappear at a high temperature. Therefore, the pretreated ferroelectric ceramic is used at a temperature lower than the disappearance temperature of the space charge polarization. The disappearance temperature of the space charge polarization can be, for example, in the range of 200° C. to 600° C. Even when the space charge polarization disappears, the space charge polarization can be generated by performing the pretreatment again.

The shape of the ferroelectric ceramic is not particularly limited, but may be, for example, a sheet-like, block-like, or solidified powdery ferroelectric ceramic solidified.

In a preferable aspect, the ceramic element has an electrode electrically connected to the ferroelectric ceramic. The electrode is not particularly limited, and examples thereof include electrodes of Pt, Cu, Ag, Au, Pd, Ni, and Sn.

In a preferable aspect, the ceramic element may be one in which electrodes are formed on both surfaces of a sheet of ferroelectric ceramic.

In one aspect, the ceramic element may be a laminate in which a plurality of ferroelectric ceramic sheets are stacked with an internal electrode interposed therebetween.

The power extraction device for extracting power from the ceramic element is not particularly limited as long as it can extract power from the ceramic element, and for example, a general full-wave rectifier circuit, a half-wave rectifier circuit, a conducting wire, a smoothing circuit, a diode, or a thyristor is used.

The heat source is not particularly limited as long as the temperature changes with time. Examples of the heat source include an internal combustion engine, factory exhaust, and exhalation.

The electrical device is not particularly limited as long as it accumulates or uses the electric power generated by the ceramic element, and typically includes a battery, a capacitor, and the like.

Next, a power generation method of the present disclosure will be described.

A power generation method of the present disclosure is a power generation method using a ferroelectric ceramic having a Curie temperature of 90° C. or lower, and includes applying a DC electric field to the ferroelectric ceramic at a temperature higher than the Curie temperature to generate space charge polarization inside the ferroelectric ceramic; and applying a temporal temperature change exceeding the Curie temperature to the ferroelectric ceramic to generate a pyroelectric current.

The ferroelectric ceramic having a Curie temperature of 90° C. or lower is the same as the ferroelectric ceramic described for the power generation system.

First, as a pretreatment, a DC electric field is applied to the ferroelectric ceramic at a temperature higher than the Curie temperature to generate the space charge polarization therein. Such a pretreatment is the same as the pretreatment described for the power generation system.

Next, by applying a temporal temperature change exceeding the Curie temperature of the ferroelectric ceramic to the pretreated ferroelectric ceramic, a pyroelectric current is generated.

The temperature change is applied by a heat source. Such a heat source is the same as the heat source described for the power generation system.

The temperature change occurs with time across the Curie temperature of the ferroelectric ceramic. In other words, the temperature change in the present disclosure is a temperature change in which the temperature rises from a temperature lower than the Curie temperature with time and exceeds the Curie temperature, and a temperature change in which the temperature falls from a temperature exceeding the Curie temperature with time and reaches a temperature lower than the Curie temperature.

The upper limit of the temperature change is a temperature lower than the temperature at which the space charge polarization of the ferroelectric ceramic disappears, and may be a temperature lower by preferably 30° C. or more, more preferably 100° C. or more, and still more preferably 150° C. or more.

In a preferable aspect, the temperature change is a temperature change that periodically repeats temperature increase and temperature decrease.

The temperature change may have a difference from the Curie temperature of the ferroelectric ceramic of preferably 1° C. to 30° C., and more preferably 5° C. to 20° C. By making the temperature change larger, a sufficient pyroelectric effect can be obtained. In addition, by making the temperature change smaller, the temperature becomes a temperature away from the disappearance temperature of the space charge polarization, and the disappearance of the space charge polarization can be prevented.

When the temperature change repeats periodically, the cycle may be preferably 1 to 500 cycles/sec, more preferably 10 to 300 cycles/sec, and still more preferably 50 to 200 cycles/sec. By making such a cycle faster, the power generation amount per unit time can be further increased. In addition, the pyroelectric effect can be more reliably obtained by delaying the cycle.

The power generated by the power generation method is extracted from the ferroelectric ceramic by a power extraction device for extracting power from the ferroelectric ceramic. Such a power extraction device is the same as the power extraction device described with respect to the power generation system above.

The power extracted as described above is stored in an electrical device, typically a battery or capacitor.

The power generation system and the power generation method of the present disclosure can be used for power generation using heat generated from an internal combustion engine, factory exhaust, and the like. In addition, the power generation system of the present disclosure can be incorporated into a mask, and can be used as a power source of an IoT device for inspection combined with a sensor that generates power by heat of exhalation and reads vital signs.

Hereinafter, a power generation system and a power generation method of the present disclosure will be described in examples, but the present disclosure is not limited to such examples.

EXAMPLES (Production of Ceramic Element)

As ferroelectric ceramics, single plates (size: 5 mm×5 mm×0.3 mm) of composite oxides and transition metal-doped composite oxides shown in Table 1 were prepared. Each of the ferroelectric ceramics was synthesized by a solid phase reaction method using an oxide and a carbonate of each element as raw materials. The Curie temperature was estimated from the point that the relative permittivity was maximum in the temperature dependence of the relative permittivity measured using an LCR meter (E4980A: Keysight) and a temperature adjustment variable stage.

TABLE 1

| Sample No. | Additive element | Addition amount (mol %) | Composite oxide | Curie temperature (° C.) |
|---|---|---|---|---|
| 1 | Cu | 0.5 | $BaTiO_3$ | 120 |
| 2 | Cu | 0.5 | $(Ba_{0.90}Sr_{0.10})TiO_3$ | 89 |
| 3 | Cu | 0.5 | $(Ba_{0.80}Sr_{0.20})TiO_3$ | 62 |
| 4 | — | 0 | $(Ba_{0.75}Sr_{0.25})TiO_3$ | 50 |
| 5 | Cu | 0.2 | $(Ba_{0.75}Sr_{0.25})TiO_3$ | 48 |
| 6 | Cu | 0.4 | $(Ba_{0.75}Sr_{0.25})TiO_3$ | 46 |
| 7 | Cu | 0.5 | $(Ba_{0.75}Sr_{0.25})TiO_3$ | 45 |
| 8 | Cu | 0.6 | $(Ba_{0.75}Sr_{0.25})TiO_3$ | 44 |
| 9 | Cu | 1.0 | $(Ba_{0.75}Sr_{0.25})TiO_3$ | 40 |
| 10 | Fe | 0.2 | $(Ba_{0.75}Sr_{0.25})TiO_3$ | 47 |
| 11 | Fe | 0.4 | $(Ba_{0.75}Sr_{0.25})TiO_3$ | 45 |
| 12 | Fe | 0.5 | $(Ba_{0.75}Sr_{0.25})TiO_3$ | 43 |
| 13 | Fe | 0.6 | $(Ba_{0.75}Sr_{0.25})TiO_3$ | 42 |
| 14 | Fe | 1.0 | $(Ba_{0.75}Sr_{0.25})TiO_3$ | 38 |
| 15 | Mn | 0.2 | $(Ba_{0.75}Sr_{0.25})TiO_3$ | 45 |
| 16 | Mn | 0.4 | $(Ba_{0.75}Sr_{0.25})TiO_3$ | 44 |
| 17 | Mn | 0.5 | $(Ba_{0.75}Sr_{0.25})TiO_3$ | 43 |
| 18 | Mn | 0.6 | $(Ba_{0.75}Sr_{0.25})TiO_3$ | 40 |
| 19 | Mn | 1.0 | $(Ba_{0.75}Sr_{0.25})TiO_3$ | 36 |
| 20 | — | 0 | $(Ba_{0.70}Sr_{0.30})TiO_3$ | 30 |
| 21 | Cu | 0.2 | $(Ba_{0.70}Sr_{0.30})TiO_3$ | 28 |
| 22 | Cu | 0.4 | $(Ba_{0.70}Sr_{0.30})TiO_3$ | 26 |
| 23 | Cu | 0.5 | $(Ba_{0.70}Sr_{0.30})TiO_3$ | 25 |
| 24 | Cu | 0.6 | $(Ba_{0.70}Sr_{0.30})TiO_3$ | 24 |
| 25 | Cu | 1.0 | $(Ba_{0.70}Sr_{0.30})TiO_3$ | 23 |
| 26 | Fe | 0.2 | $(Ba_{0.70}Sr_{0.30})TiO_3$ | 24 |
| 27 | Fe | 0.4 | $(Ba_{0.70}Sr_{0.30})TiO_3$ | 20 |
| 28 | Fe | 0.5 | $(Ba_{0.70}Sr_{0.30})TiO_3$ | 18 |

TABLE 1-continued

| Sample No. | Additive element | Addition amount (mol %) | Composite oxide | Curie temperature (° C.) |
|---|---|---|---|---|
| 29 | Fe | 0.6 | $(Ba_{0.70}Sr_{0.30})TiO_3$ | 17 |
| 30 | Mn | 0.5 | $(Pb_{0.60}Sr_{0.40})TiO_3$ | 190 |
| 31 | — | 0 | $(Pb_{0.40}Sr_{0.60})TiO_3$ | 31 |
| 32 | Mn | 0.5 | $(Pb_{0.40}Sr_{0.60})TiO_3$ | 30 |
| 33 | Cu | 0.5 | $0.8Ba(Zr_{0.2}Ti_{0.8})O_3\text{—}0.2(Ba_{0.7}Ca_{0.3})TiO_3$ | 48 |
| 34 | Cu | 0.5 | $0.7Ba(Zr_{0.2}Ti_{0.8})O_3\text{—}0.3(Ba_{0.7}Ca_{0.3})TiO_3$ | 58 |

Pt electrodes were formed on both surfaces of the obtained ferroelectric ceramic single plate by sputtering. Next, as pretreatment, a DC electric field of 2 kV/mm was applied at 150° C. for 1 hour, and then cooling was performed to 20° C. while applying the electric field. In this way, a ceramic element used in the power generation system and the power generation method of the present disclosure was obtained.

(Measurement of Attenuation Rate of Pyroelectric Current)

Pt electrodes on both surfaces of the ceramic element subjected to the pretreatment were connected to an electrometer via a conductive wire, and the temperature of the ceramic element to which the conductive wire was connected was changed on a temperature control stage, thereby measuring a pyroelectric current when the temperature of the ceramic element was changed. The temperature change was periodically changed in a range of ±30° C. of the Curie temperature of the ferroelectric ceramic of each ceramic element. For each sample, the current density of the pyroelectric current was measured, and a peak value of the pyroelectric current was compared with a peak value of a first cycle after applying the temperature changes of 10 cycles and 100 cycles to calculate the attenuation rate of the pyroelectric current. The attenuation rate was calculated based on the following equation:

$$\text{Attenuation rate} = \frac{I_{1st} - I_{Nth}}{I_{1st}} \times 100(\%)$$

wherein, $I_{1st}$ and $I_{Nth}$ are peak top values of the current density of the pyroelectric current in the first cycle and the N-th cycle, respectively.

The results are shown in Table 2 below. For the determination, one having an attenuation rate of less than 5% after 10 cycles of temperature change application was defined as G, and one having an attenuation rate of less than 10% after 100 cycles of temperature change application was defined as G*. Those having an attenuation rate of 5% or more after 10 cycles of temperature change application were rated as NG.

TABLE 2

| Sample No. | Attenuation rate (%) of pyroelectric current after 10 cycles | Attenuation rate (%) of pyroelectric current after 100 cycles | Determination |
|---|---|---|---|
| 1 | 8.2 | 43.6 | NG |
| 2 | 3.3 | 15.6 | G |
| 3 | 1.2 | 12.1 | G |
| 4 | 2.4 | 5.9 | G* |
| 5 | 0.8 | 2.3 | G* |
| 6 | 0.8 | 1.3 | G* |
| 7 | 0.2 | 0.8 | G* |
| 8 | 0.2 | 0.8 | G* |
| 9 | 0.6 | 0.9 | G* |
| 10 | 1.8 | 4.8 | G* |
| 11 | 0.7 | 4.8 | G* |
| 12 | 0.2 | 3.2 | G* |
| 13 | 0.7 | 2.1 | G* |
| 14 | 2.4 | 5.9 | G* |
| 15 | 0.2 | 0.3 | G* |
| 16 | 0.5 | 0.7 | G* |
| 17 | 0.2 | 0.6 | G* |
| 18 | 0.4 | 0.5 | G* |
| 19 | 0.3 | 0.3 | G* |
| 20 | 1.3 | 6.0 | G* |
| 21 | 0.1 | 2.3 | G* |
| 22 | 0.1 | 0.8 | G* |
| 23 | 0.2 | 1.5 | G* |
| 24 | 0.6 | 2.3 | G* |
| 25 | 0.3 | 1.2 | G* |
| 26 | 0.4 | 0.4 | G* |
| 27 | 0.3 | 0.6 | G* |
| 28 | 0.2 | 1.3 | G* |
| 29 | 1.8 | 1.9 | G* |
| 30 | 46.5 | 99.8 | NG |
| 31 | 0.1 | 0.2 | G* |
| 32 | 0.5 | 1.9 | G* |
| 33 | 0.8 | 1.8 | G* |
| 34 | 0.6 | 8.7 | G* |

From the above results, it was confirmed that the sample having a Curie temperature of 90° C. or lower has a small attenuation rate of the pyroelectric current after power generation. In particular, it was confirmed that the sample having a Curie temperature of 60° C. or lower has a small attenuation rate of the pyroelectric current after 100 cycles as well.

(Measurement of P-E Hysteresis Curve)

Figure 2:
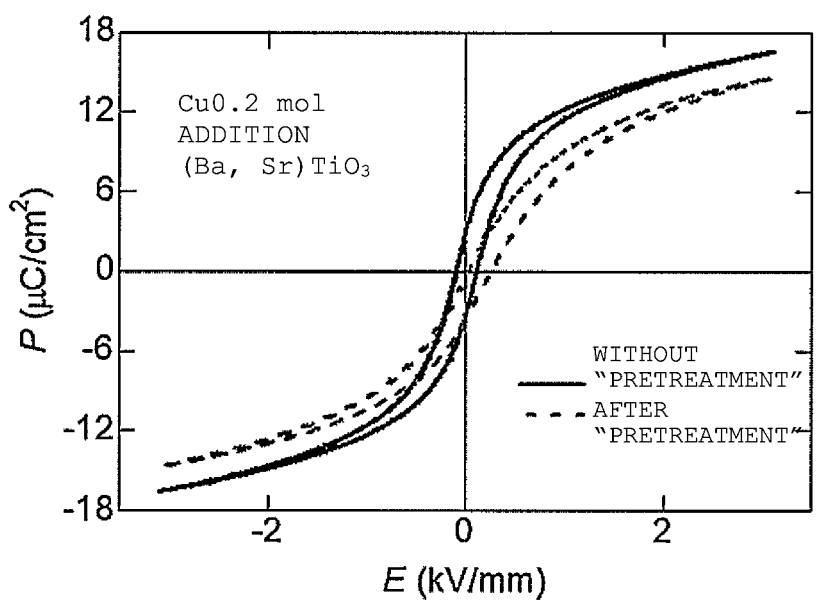
FIG. 2 illustrates a P-E hysteresis curve for a sample number 7.

For the sample number 7, the P-E hysteresis curves before and after the pretreatment were measured. The results are shown in FIG. 2. Comparing the P-E hysteresis curves of the ceramic elements before and after the pretreatment, it was confirmed that the P-E hysteresis curve was shifted to the right (electric field positive direction) and space charge polarization was formed in the ceramic elements after the pretreatment.

(Measurement of Pyroelectric Current Value)

Figure 3:
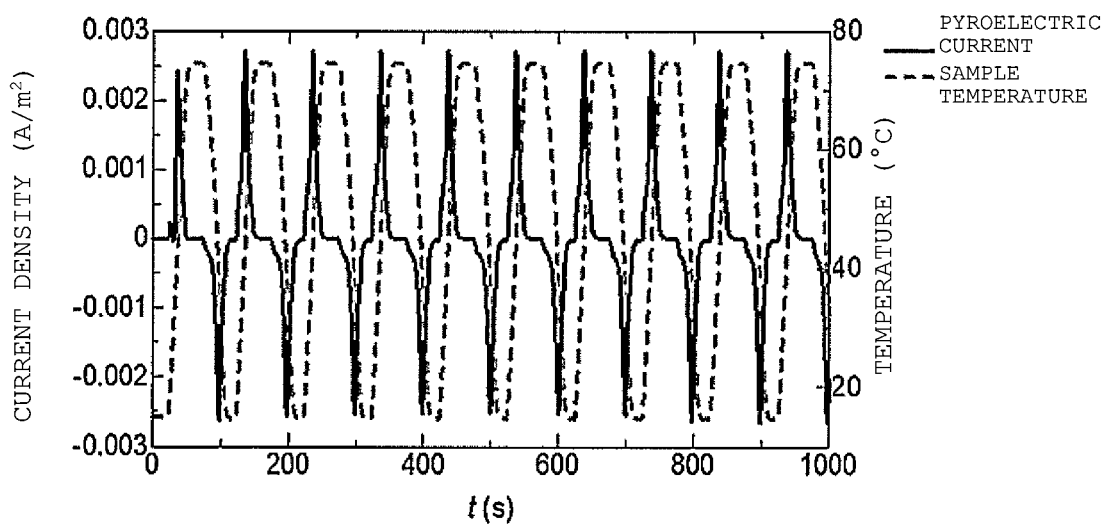
FIG. 3 illustrates a behavior of a pyroelectric current generated when a temperature change is applied to the sample number 7.

Using the ceramic element of sample number 7 (after pretreatment), the pyroelectric current value was measured when the temperature of the element was changed in the temperature region exceeding the Curie temperature. The results are shown in FIG. 3. It was confirmed that the pyroelectric current continued to flow with respect to the temporal temperature change exceeding 45° C. of the Curie temperature. These results show that when the temperature drops below the Curie temperature, the ferroelectric polarization is spontaneously polarized in one direction again without application of an electric field from the outside.

(Measurement of Power Generation Amount)

Figure 4:
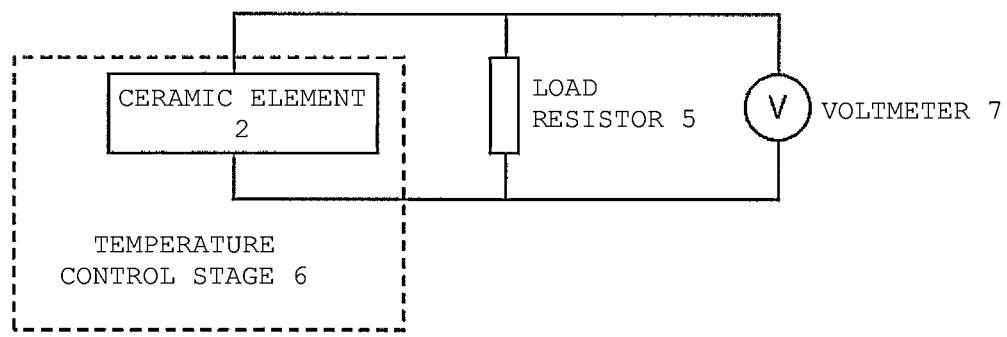
FIG. 4 is a schematic configuration diagram illustrating a measurement system used for calculating a power generation amount.
Figure 5:
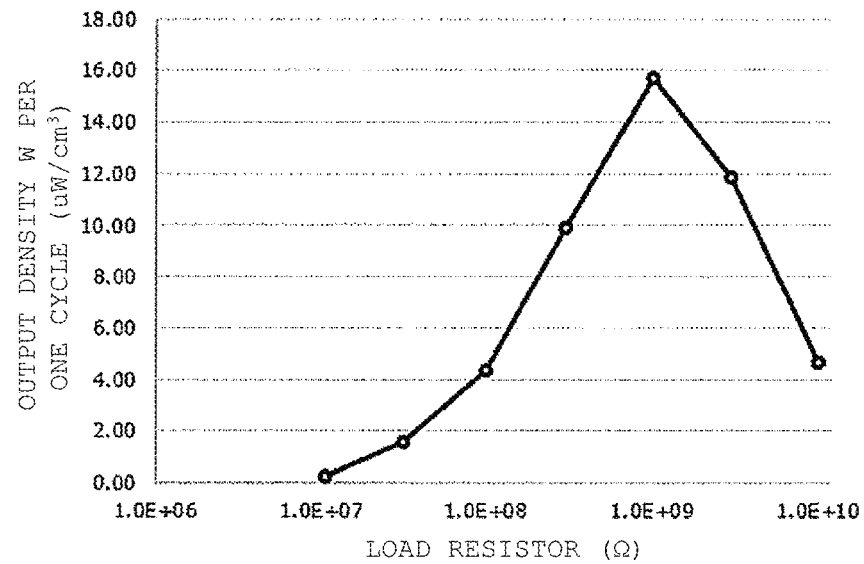
FIG. 5 is a graph illustrating the power generation amount for the sample number 7 when various load resistors are used.

The power generation amount was estimated for sample number 7. As shown in FIG. 4, the power generation amount was estimated by connecting a load resistor 5 to a conductive wire connected to a front surface and a back surface of the ceramic element 2, and measuring an electromotive force generated at both ends of a load resistor with a voltmeter 7 when the temporal temperature change over the Curie temperature was applied to the ceramic element on the temperature control stage. The electromotive force when the temporal temperature change was applied to the ceramic element with respect to a plurality of load resistance values was measured, an instantaneous power consumption P was determined by $P=V^2/R$ (wherein P: power (W), V: electromotive force (V), and R: load resistance value (Ω)), and the power consumption P was time-integrated to calculate an energy U (J) consumed by the load resistor with respect to the temperature change. A temperature change from a low temperature side to a high temperature side and returning to a low temperature side again was defined as one cycle, an average consumed energy of seven temperature cycles was calculated, and the average consumed energy was divided by a time required for one temperature change cycle to calculate a power generation amount per cycle. The results are shown in FIG. 5. From the results, it was confirmed that the power generation amount was maximized at the load resistor of 1 GΩ.

(TSDC Measurement)

Figure 6:
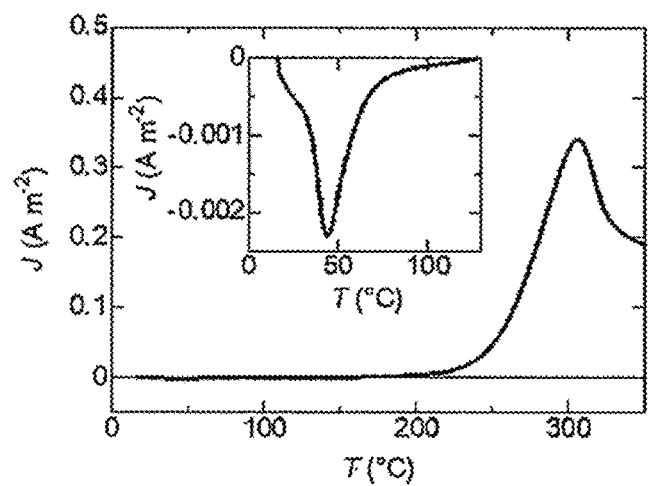
FIG. 6 is a graph illustrating a result of TSDC measurement for the sample number 7.

TSDC measurement was performed for sample number 7. The results are shown in FIG. 6. A negative current peak that can be confirmed in the vicinity of 40° C. is a pyroelectric current corresponding to the Curie temperature at which the ferroelectric polarization disappears (refer to the inset in FIG. 6). It was confirmed that there was a large current peak flowing from the vicinity of 250° C. to the positive side when the temperature was increased. Since this current peak was a temperature at which the space charge accumulated by the pretreatment was released, it was confirmed that space charge polarization existed inside the ferroelectric ceramic.

The power generation system and the power generation method of the present disclosure can be suitably used for a device that requires a permanent power supply.

DESCRIPTION OF REFERENCE SYMBOLS

1: Heat source
2: Ceramic element
3: Power extraction device
4: Electrical device
5: Load resistor
6: Temperature control stage
7: Voltmeter

The invention claimed is:

1. A power generation system comprising:
a ceramic element including a ferroelectric ceramic having a Curie temperature of 90° C. or lower and a space charge polarization; and
a power extraction device that extracts power from the ceramic element when a temporal temperature change exceeding the Curie temperature is applied to the ferroelectric ceramic.

2. The power generation system according to claim 1, wherein the Curie temperature is 60° C. or lower.

3. The power generation system according to claim 2, wherein the Curie temperature is −30° C. to 60° C.

4. The power generation system according to claim 1, wherein the Curie temperature is −50° C. to 90° C.

5. The power generation system according to claim 1, wherein the ferroelectric ceramic is a perovskite-type ferroelectric.

6. The power generation system according to claim 5, wherein the perovskite-type ferroelectric is selected from $BaTiO_3$, $(Ba,Sr)TiO_3$, $(Ba,Ca)TiO_3$, $Ba(Zr,Ti)O_3$, $Ba(Sn,Ti)O_3$, $Ba(Hf,Ti)O_3$, $(Ba,Ca)(Zr,Ti)O_3$, $(Ba,Ca)(Hf,Ti)O_3$, $(Ba,Ca)(Sn,Ti)O_3$, $Pb(Mg_{1/3}Nb_{2/3})O_3$—$PbTiO_3$, $(Pb,Sr)TiO_3$, and $(Pb,Ba)ZrO_3$, and a transition metal-doped composite oxide in which Cu, Mn, Fe, Cr, Mg, or V is added to the composite oxide.

7. The power generation system according to claim 5, wherein the perovskite-type ferroelectric is a transition metal-doped composite oxide.

8. The power generation system according to claim 7, wherein an addition amount of the transition metal is 0.01 mol % to 1.0 mol % with respect to the composite oxide.

9. The power generation system according to claim 1, wherein the ceramic element includes at least one electrode electrically connected to the ferroelectric ceramic.

10. The power generation system according to claim 1, further comprising a heat source constructed to apply heat to the ceramic element.

11. The power generation system according to claim 1, wherein the power extraction device is selected from a general full-wave rectifier circuit, a half-wave rectifier circuit, a conducting wire, a smoothing circuit, a diode, or a thyristor.

12. A power generation method comprising:
applying a DC electric field to a ferroelectric ceramic having a Curie temperature of 90° C. or lower at a temperature higher than the Curie temperature to generate space charge polarization inside the ferroelectric ceramic; and
applying a temporal temperature change exceeding the Curie temperature to the ferroelectric ceramic to generate a pyroelectric current.

13. The power generation method according to claim 12, wherein the Curie temperature is 60° C. or lower.

14. The power generation method according to claim 13, wherein the Curie temperature is −30° C. to 60° C.

15. The power generation method according to claim 12, wherein the Curie temperature is −50° C. to 90° C.

16. The power generation method according to claim 12, wherein the ferroelectric ceramic is a perovskite-type ferroelectric.

17. The power generation method according to claim 16, wherein the perovskite-type ferroelectric is selected from $BaTiO_3$, $(Ba,Sr)TiO_3$, $(Ba,Ca)TiO_3$, $Ba(Zr,Ti)O_3$, $Ba(Sn,Ti)O_3$, $Ba(Hf,Ti)O_3$, $(Ba,Ca)(Zr,Ti)O_3$, $(Ba,Ca)(Hf,Ti)O_3$, $(Ba,Ca)(Sn,Ti)O_3$, $Pb(Mg_{1/3}Nb_{2/3})O_3$—$PbTiO_3$, $(Pb,Sr)TiO_3$, and $(Pb,Ba)ZrO_3$, and a transition metal-doped composite oxide in which Cu, Mn, Fe, Cr, Mg, or V is added to the composite oxide.

18. The power generation method according to claim 12, wherein the temporal temperature change periodically repeats a temperature increase and a temperature decrease.

19. The power generation method according to claim 18, wherein periodical repeating has a cycle of 1 to 500 cycles/sec.

20. The power generation method according to claim 12, wherein the temporal temperature change exceeds the Curie temperature of the ferroelectric ceramic by 1° C. to 30° C.

* * * * *